(12) United States Patent
Droz et al.

(10) Patent No.: US 10,304,987 B2
(45) Date of Patent: May 28, 2019

(54) HYBRID INTEGRATION OF PHOTODETECTOR ARRAY WITH DIGITAL FRONT END

(71) Applicant: Waymo LLC, Mountain View, CA (US)

(72) Inventors: Pierre-Yves Droz, Mountain View, CA (US); Caner Onal, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

(21) Appl. No.: 15/972,471

(22) Filed: May 7, 2018

(65) Prior Publication Data
US 2018/0254369 A1 Sep. 6, 2018

Related U.S. Application Data

(63) Continuation of application No. 15/383,112, filed on Dec. 19, 2016, now Pat. No. 10,002,986.

(51) Int. Cl.
*H01L 27/146* (2006.01)
*H01L 31/107* (2006.01)

(52) U.S. Cl.
CPC ...... *H01L 31/107* (2013.01); *H01L 27/14609* (2013.01); *H01L 27/14614* (2013.01); *H01L 27/14636* (2013.01); *H01L 27/14643* (2013.01); *H01L 27/14689* (2013.01)

(58) Field of Classification Search
None
See application file for complete search history.

(56) References Cited

U.S. PATENT DOCUMENTS

| 8,193,482 B2 | 6/2012 | Itzler |
| 9,529,079 B1 | 12/2016 | Droz et al. |
| 2004/0188793 A1 | 9/2004 | Lindemann et al. |

(Continued)

FOREIGN PATENT DOCUMENTS

WO 2016/167753 A1 10/2016

OTHER PUBLICATIONS

C. C. Wu et al., "High performance 22/20nm FinFET CMOS devices with advanced high-K/metal gate scheme," 2010 International Electron Devices Meeting, San Francisco, CA, 2010, pp. 27.1.1-27.1.4.doi: 10.1109/IEDM.2010.5703430 (Year: 2010).*

(Continued)

*Primary Examiner* — Whitney Moore
(74) *Attorney, Agent, or Firm* — Paradice and Li LLP

(57) ABSTRACT

The present disclosure relates to optical receiver systems. An example optical receiver system includes a first substrate with a plurality of photodetectors and a bias circuit. The bias circuit is electrically coupled to each photodetector of the plurality of photodetectors. The bias circuit is configured to provide a bias voltage to each photodetector. The optical receiver system also includes a plurality of capacitors. Each capacitor of the plurality of capacitors is electrically-coupled to a respective photodetector of the plurality of photodetectors. The optical receiver system also includes a second substrate with a read-out circuit having a plurality of channels. Each channel of the plurality of channels is capacitively-coupled to a respective photodetector via the respective capacitor.

15 Claims, 13 Drawing Sheets

Transverse Cross Sectional View

(56) References Cited

U.S. PATENT DOCUMENTS

| | | |
|---|---|---|
| 2007/0278636 A1 | 12/2007 | Mahowald |
| 2013/0341490 A1 | 12/2013 | Mansoorian et al. |
| 2016/0003674 A1 | 1/2016 | Sanson |
| 2016/0020235 A1 | 1/2016 | Yamashita |
| 2016/0043268 A1 | 2/2016 | Bai et al. |
| 2016/0161600 A1 | 6/2016 | Eldada et al. |
| 2016/0218236 A1 | 7/2016 | Dhulla et al. |
| 2016/0266243 A1 | 9/2016 | Marron |
| 2017/0131143 A1 | 5/2017 | Andreou et al. |

OTHER PUBLICATIONS

PCT Written Opinion, PCT International Application No. PCTUS2017/067042, dated Mar. 22, 2018, 6 pages.
International Search Report—PCT/US2017/067042—ISA—dated Mar. 22, 2018.

* cited by examiner

First Substrate Top View

First Substrate Transverse Cross Sectional View

Transverse Cross Sectional View

Transverse Cross Sectional View

HYBRID INTEGRATION OF PHOTODETECTOR ARRAY WITH DIGITAL FRONT END

CROSS-REFERENCE TO RELATED APPLICATION

The present application is a continuation application of, and claims the benefit of, U.S. patent application Ser. No. 15/383,112, filed Dec. 19, 2016, the content of which is herewith incorporated by reference.

BACKGROUND

Unless otherwise indicated herein, the materials described in this section are not prior art to the claims in this application and are not admitted to be prior art by inclusion in this section.

A plurality of photodetectors may be arranged in multi-element (e.g., X-by-Y) arrays, which may include scanning arrays or focal plane arrays (FPAs). Such arrays may be configured to detect light in the ultraviolet, visible, and infrared wavelength ranges, or at other wavelengths.

SUMMARY

The present disclosure generally relates to an optical receiver system that includes an array of photodetectors. The photodetectors may include single photon avalanche photodetectors (SPADs). Each SPAD of the array of photodetectors is capacitively coupled to respective channels of a digital read-out circuit. In such a scenario, an array of SPAD detectors may be directly connected to a digital readout, which may improve signal to noise ratio, response time, and other performance metrics of the optical receiver system.

In a first aspect, a system is provided. The system includes a first substrate having a plurality of photodetectors and a bias circuit. The bias circuit is electrically coupled to each photodetector of the plurality of photodetectors. The bias circuit is configured to provide a bias voltage to each photodetector. The system also includes a plurality of capacitors. Each capacitor of the plurality of capacitors is electrically coupled to a respective photodetector of the plurality of photodetectors. The system also includes a second substrate that includes a read-out circuit having a plurality of channels. Each channel of the plurality of channels is capacitively coupled to a respective photodetector via the respective capacitor.

In a second aspect, a method of manufacture is provided. The method includes providing a first substrate. The first substrate includes a plurality of photodetectors and a bias circuit. The bias circuit is electrically coupled to each photodetector of the plurality of photodetectors. The bias circuit is configured to provide a bias voltage to each photodetector. The method also includes providing a second substrate that includes a read-out circuit having a plurality of channels. The method additionally includes coupling the first substrate and the second substrate so as to form a plurality of capacitors. Each capacitor of the plurality of capacitors is coupled to a respective photodetector of the plurality of photodetectors and a respective channel of the plurality of channels.

Other aspects, embodiments, and implementations will become apparent to those of ordinary skill in the art by reading the following detailed description, with reference where appropriate to the accompanying drawings.

DETAILED DESCRIPTION

Figure 1:
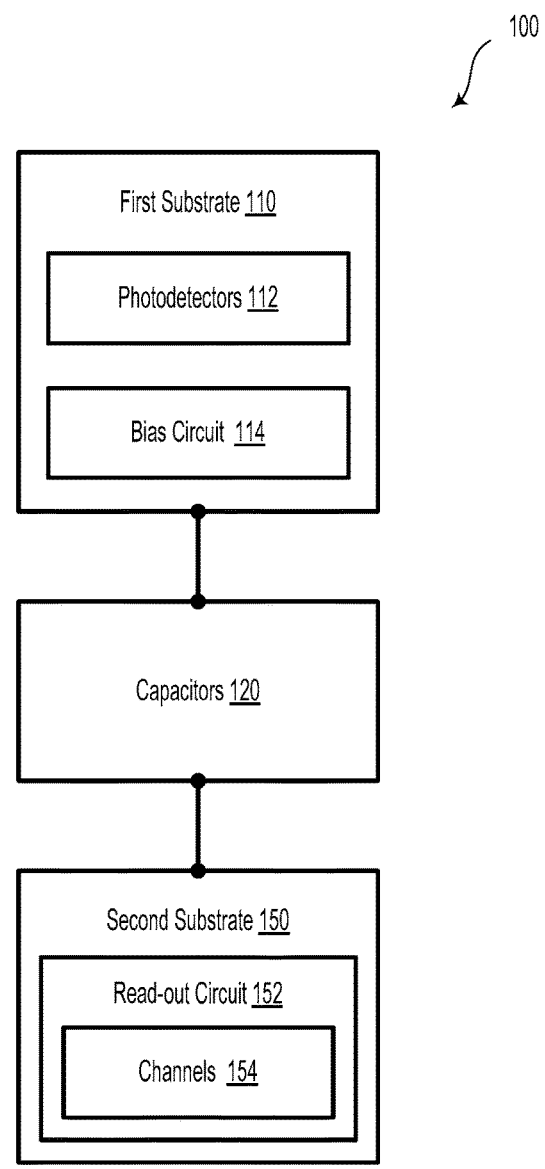
FIG. 1 illustrates a system, according to an example embodiment.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

Conventional single photon avalanche photodetectors (SPADs) may be reverse-biased to 70 volts or more. Such high voltages may produce electric field strengths that are higher than conventional CMOS processes may withstand. As such, photo signals from conventional SPAD devices may be initially converted to analog signals using an analog readout integrated circuit (ROIC).

In an example embodiment, an optical receiver system may include an array of SPADs that are capacitively-coupled (e.g., AC-coupled) to digital readout circuitry (e.g., a digital ROIC) based on a CMOS process. Such an arrangement may provide a way to directly read-out respective photo signals in a digital format. As such, an optical receiver system that includes such a SPAD array and digital readout circuit may provide better signal to noise and temporal response as compared to conventional techniques.

Specifically, each SPAD device may be coupled to a respective capacitor. Each respective capacitor may be coupled directly to a gate terminal of a CMOS transistor. In some embodiments, the capacitor may include one or more metal layers that may be deposited in a standard CMOS process. Additionally or alternatively, the capacitor may be formed by an air-gap or proximity coupling between the SPAD array and CMOS ROIC. The capacitor may utilize an inter-metal dielectric or an oxide layer grown directly on the semiconductor surface.

In such a scenario, a quenching voltage pulse of ~70V may be reduced to an output voltage pulse of 5 volts or less (as received at the ROIC). In some embodiments, the voltage received via the ROIC may be tunable based on the capacitance of the respective coupling capacitors. It will be understood that quenching voltage pulse values may include a variety of voltages, including, but not limited to a range between 20 V to 100 V.

In some example embodiments, the SPAD array and CMOS circuitry may be arranged on a silicon-on-insulator (SOI) wafer. However, other substrate materials are possible. Furthermore, the SPAD array may be hybridized onto a wafer containing the CMOS circuitry via bump-bonding or fusion bonding. Other hybridization fabrication techniques are possible and contemplated.

II. Example Systems

FIG. 1 illustrates a system 100, according to an example embodiment. In some embodiments, the system 100 may represent an optical receiver portion of a Light Detection and Ranging (LIDAR) system. That is, system 100 may be configured to receive light pulses emitted from an illuminator portion (e.g., laser) of a LIDAR system.

System 100 includes a first substrate 110 and a second substrate 150. The first substrate 110 includes a plurality of photodetectors 112. The photodetectors 112 may be arranged in a rectangular array or a linear array, however other arrangements of the photodetectors 112 are contemplated. In an example embodiment, the photodetectors 112 may include a plurality of single photon avalanche photodiodes (SPADs).

SPADs may include semiconductor devices based on a p-n junction. In some embodiments, the SPADs may be formed from indium gallium arsenide (InGaAs) and may be sensitive to light having a wavelength within the range of 800-905 nm or at or about 1550 nanometers. That is, the SPADs may generate charge carriers in response to illumination with photons having a wavelength of 800-905 nm or ~1550 nm.

Under some operating conditions, the SPADs may be reverse-biased at a voltage that exceeds a breakdown voltage of the p-n junction. Under reverse bias of greater than 50 volts, the electric field may be greater than about $3 \times 10^5$ V/cm. Under such an electric field, a charge carrier injected into the depletion layer of the p-n junction (e.g., as a result of a photon absorption event) may trigger a self-sustaining avalanche current process. In such a scenario, the current may increase during rise-times of less than a nanosecond. Thus, a waveform of the SPAD may include a sharp current or voltage pulse. The leading edge of the pulse may represent (within ~20 picosecond jitter) the arrival time of the absorbed photon. The current continues to flow within the SPAD until the avalanche process is "quenched" by lowering the bias voltage down to or below the breakdown voltage of the p-n junction. As such, the lower electric field is no longer able to sustain the avalanche current process. In order to be able to detect another photon, the bias voltage is raised above the breakdown voltage of the p-n junction.

The first substrate 110 also includes a bias circuit 114, which may be configured to provide a bias voltage greater than the breakdown voltage of the SPAD and quench the avalanche process by lowering the bias voltage below the breakdown voltage. In other words, the bias circuit 114 may act as a quenching circuit for the photodetectors 112. The bias circuit 114 is electrically coupled to each photodetector of the plurality of photodetectors 112. The bias circuit 114 may be configured to provide a bias voltage to each of the photodetectors 112. For example, in the case where the photodetectors 112 are SPADs, the bias circuit 114 may be configured to provide a reverse bias voltage of about 70 volts. Other bias voltages are contemplated.

The bias circuit 114 may be a passive quenching circuit. That is, the bias circuit 114 may include a resistor in series with the SPAD. In such a scenario, the avalanche current process "self-quenches" because it develops a voltage drop across the resistor, which may be 100 kΩ or more. After quenching the avalanche current, the SPAD bias may ramp back up to above the breakdown voltage of the p-n junction, effectively "resetting" the device to detect photons.

Additionally or alternatively, the bias circuit 114 may be an active quenching circuit. In an example embodiment, a comparator portion of the active quenching circuit may detect an onset of the avalanche current pulse across a resistor and may responsively provide a digital output pulse, synchronous with the photon arrival time. In response to the digital output pulse, a bias portion of the active quenching circuit may then reduce the bias voltage to below the breakdown voltage of the p-n junction and rapidly reset the bias voltage to above the breakdown voltage. Such active quenching circuits may reset SPAD devices more quickly than their passive counterparts.

The system 100 includes a plurality of capacitors 120. Each capacitor of the plurality of capacitors 120 is electrically coupled to a respective photodetector of the plurality of photodetectors 112. In some embodiments, the plurality of capacitors 120 may represent discrete capacitor devices (e.g., a ceramic capacitor, a film or paper capacitor, etc.). For example, at least one of the plurality of capacitors 120 may be a tantalum or aluminum capacitor. However, the plurality of capacitors 120 may additionally or alternatively include an air gap, a gap between two conductors separated by a dielectric material (e.g., a plate capacitor or a separation between two metal traces). Namely, the plurality of capacitors 120 may be configured to store electrical energy in an electric field when a potential difference (e.g., a voltage) is provided across the dielectric material. While embodiments herein describe fixed value capacitors, variable capacitor devices are possible and contemplated. For example, a capacitance of a variable capacitor device may be adjusted based on a rise time, a reset time, a peak voltage, and/or a bias voltage value.

The system 100 also includes a second substrate 150. In some embodiments, the second substrate 150 may include a silicon-on-insulator (SOI) material (e.g., a SOI wafer). Additionally or alternatively, the second substrate 150 may include silicon, gallium arsenide, and/or other semiconductor materials. The second substrate 150 includes a read-out circuit 152 having a plurality of channels 154. Each channel of the plurality of channels 154 is capacitively-coupled to a respective photodetector of the plurality of photodetectors 112 via a respective capacitor of the plurality of capacitors 120. As described herein, the plurality of capacitors 120 may be configured to provide "DC-blocking" between the photodetectors 112 and the read-out circuit 152. That is, although the photodetectors 112 may be biased at 70 volts, a DC offset of an input voltage waveform to the channels 154 of the read-out circuit 152 may be substantially zero.

In example embodiments, the read-out circuit 152 may include a digital read-out integrated circuit (ROIC) fabricated according to a complementary metal-oxide-semiconductor (CMOS) manufacturing process. For example, the CMOS manufacturing process may include design features (e.g., minimum feature sizes) less than 32 nanometers in size. In some embodiments, the design features may include a length of the CMOS transistor channel (e.g., a distance between a drain and source of the transistor).

In some embodiments, each channel of the plurality of channels 154 includes a respective CMOS transistor. In such scenarios, each capacitor of the plurality of capacitors 120 is electrically coupled to an input gate terminal of the respective CMOS transistor. Additionally or alternatively, each capacitor of the plurality of capacitors 120 may be electrically coupled to an input of a CMOS logic gate, such as an inverter or another type of logic device.

In example embodiments, a respective capacitance value of each capacitor of the plurality of capacitors 120 may be selected based on at least the bias voltage and a desired input voltage at the respective input gate terminal. For example, the desired input voltage may be less than 5.5 volts. The desired input voltage may be based on a maximum electric field strength that can be sustained by the CMOS transistor or other circuitry of the read-out circuit 152.

In some embodiments the plurality of capacitors 120 is disposed on the first substrate 110. That is, the plurality of capacitors 120 may be located and/or manufactured as part of the first substrate 110. Additionally or alternatively, at least a portion of the plurality of capacitors 120 may be disposed on the second substrate 150. For instance, the plurality of capacitors 120 may be formed by a gap or region between at least two metal layers disposed on the second substrate 150.

In further embodiments, the plurality of capacitors 120 may include an air gap between the first substrate and the second substrate. Additionally or alternatively, the plurality of capacitors 120 may include a dielectric layer with an appropriate dielectric constant, k. That is, the air gap and/or the dielectric layer may provide a capacitance value sufficient to provide DC-blocking between the photodetectors 112 and the read-out circuit 152.

In some embodiments, the first substrate 110 and the second substrate 150 are physically coupled. For example, the first substrate 110 and the second substrate 150 may be coupled via a fusion bonding process or a bump bonding process. Other manufacturing techniques or processes configured to physically couple two substrates are contemplated.

Figure 2A:
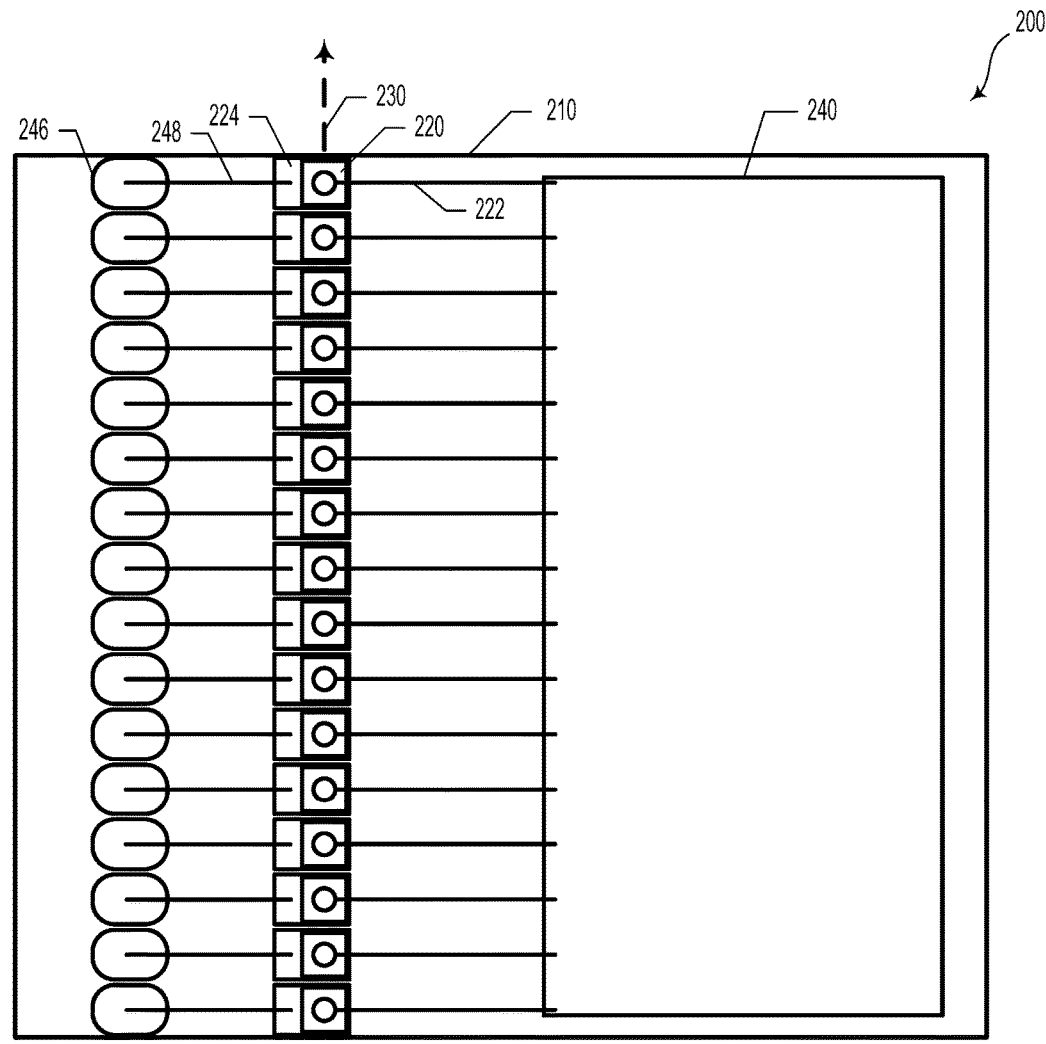
FIG. 2A illustrates a portion of a system, according to an example embodiment.
Figure 2A:
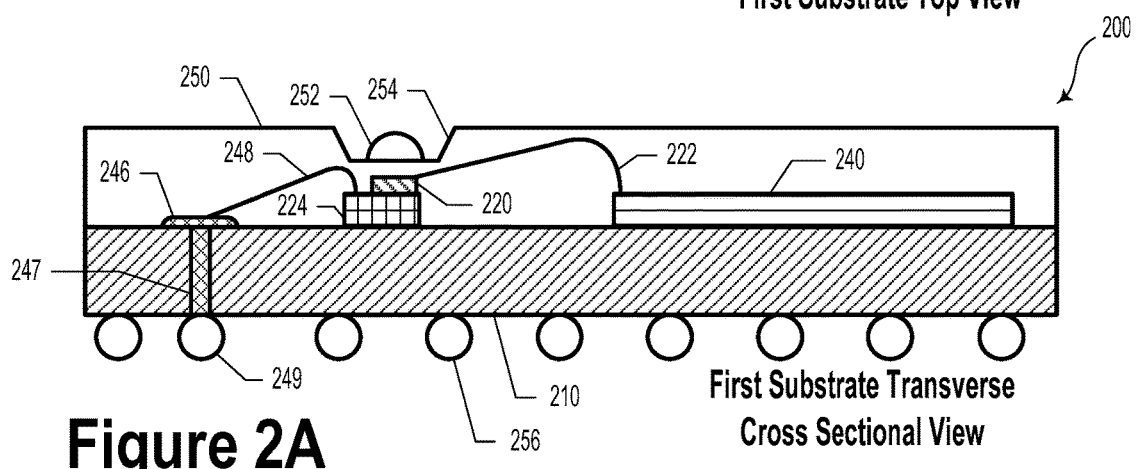

FIGS. 2A-2E illustrate various portions of, and configurations for, a system 200, which may be similar or identical to system 100, as illustrated and described with reference to FIG. 1. For example, FIG. 2A illustrates a portion of a system 200, according to an example embodiment. FIG. 2A may illustrate a portion of system 200 that is similar or identical to the first substrate 110 of system 100 as illustrated and described in reference to FIG. 1. Namely, system 200 includes a substrate 210 and a plurality of detector elements 220. System 200 also includes a bias circuit 240, bias bond wires 222, signal pads 246, and a conductive plug 247.

Substrate 210 may include a semiconductor material such as silicon or gallium arsenide. In some embodiments, the substrate 210 may include InGaAs grown on an InP substrate. It will be understood that other substrate materials are possible. Additionally or alternatively, substrate 210 may include a printed circuit board (PCB) or another substrate material. In some embodiments, substrate 210 may be a flexible substrate.

The detector elements 220 are configured to detect light within a desired spectral range and/or at one or more wavelengths. In an example embodiment, the detector elements 220 may be configured to detect light at 1550 nm, however, other wavelengths and/or spectral ranges are possible. In an example embodiment, at least one of the detector elements 220 could be an avalanche photodiode (APD) or a single photon avalanche diode (SPAD). Additionally or alternatively, some embodiments may include an array of SPAD detectors, each of which may be connected in parallel. Such an arrangement of SPAD detectors may include a silicon photomultiplier (SiPM). For example, detector element 220 may include an InGaAs APD configured to detect light at wavelengths around 1550 nm. Other types of photodetectors are possible and contemplated herein.

Each detector element of the plurality of detector elements 220 may be die-bonded to a respective mount 224. The mounts 224 may be die-bonded to the substrate 210. A signal bond wire 248 may be connected from the respective mount 224 to a respective signal pad 246. In an example embodiment, the bias bond wires 222 and the signal bond wires 248 may be arranged such that the wire loop areas (e.g., cross-sectional inductive loop area) are similar or identical. Such an arrangement may eliminate or reduce some parasitic capacitive or inductive coupling due to the wire bonds.

In an example embodiment, the bias circuit 240 may include circuitry appropriate for a voltage power supply. Namely, the bias circuit 240 may provide a reverse bias voltage that is greater than a breakdown voltage of the photodetector elements 220 (e.g., 70 volts or more).

In an example embodiment, the plurality of detector elements 220 may include sixteen detector elements arranged in a single column (e.g., a linear array). For example, the detector elements of the plurality of detector elements 220 could be arranged along, or could be at least parallel to, a primary axis 230. It will be understood that other arrangements of the respective detector elements are possible. For instance, the detector elements could be arranged in two columns that are parallel to primary axis 230. While FIG. 2A illustrates sixteen detector elements, more or fewer detector elements are contemplated.

In an example embodiment, each detector element could be substantially square with a 350 micron side length. Furthermore, the detector pitch could be 400 microns along the primary axis 230. That is, a center-to-center distance between neighboring detector elements could be 400 microns. Put another way, assuming a 350 micron detector side length, when arranged along the primary axis 230, the detector elements may have 50 microns between them. It will be understood that other values for detector element size and detector pitch are possible and contemplated. For example, with smaller detector elements (e.g., 200 microns on a side), detector pitches of less than 50 microns are possible. Additionally or alternatively, some detector elements may include a monolithic detector arrangement. Such an arrangement may include a detector material (e.g., silicon) arranged adjacent (e.g., on the same substrate) to part or all of the detectors readout circuitry.

While not illustrated in FIG. 2A, various arrangements of system 200 that include multiple instances of substrate 210 are possible. In an example embodiment, during back end of line (BEOL) processing, the substrate 210 may be diced within 25 microns of an outermost detector element. In such a situation, another substrate similar to that of substrate 210 may be arranged adjacent to substrate 210 to maintain identical detector pitch across the different substrates. Other arrangements of system 200 are contemplated.

As shown in the transverse cross sectional view of FIG. 2A, in some embodiments, the system 200 may include an encapsulation 250 overlaying at least the plurality of detector elements 220. The encapsulation 250 may include an epoxy or silicone. In some embodiments, the encapsulation 250 may include Sil-Poxy silicone adhesive, SolEpoxy OP7200, Nitto NT-324H, Nuva-Sil Epoxy resin, or silica. While a variety of application methods are contemplated, in an example embodiment, the encapsulation 250 may be provided using a one- or two-step transfer mold process. In an embodiment, the transfer mold may be registered to substrate with a fiducial mark on the substrate 210, or another type of alignment feature or landmark.

The encapsulation 250 may include a trench portion 254 that may be disposed above the plurality of detector elements 220. In an example embodiment, the trench portion 254 could have sidewalls with a 60 degree sidewall angle. In some embodiments, the trench portion 254 may provide some measure of detector isolation from neighboring devices. For example, in some embodiments, optical crosstalk between adjacent photodetector elements may be reduced below −30 dB. As an illustrative example, the trench portion 254 may be 800 microns in width (measured from an opening of the trench). It will be understood that other trench profiles (e.g., depth, width, sidewall angle) are contemplated. Specifically, trench profiles may be selected in an effort to reduce optical crosstalk between neighboring detectors.

In an example embodiment, the encapsulation 250 proximate to each detector element of the plurality of detector elements 220 may include a microlens 252. In an example embodiment, the microlens 252 may have a hemispherical shape, although other shapes and lens types are possible and contemplated. For example, the microlenses 152 may be formed from micro-Fresnel lenses, which may focus light by refraction in a set of concentric curved surfaces. Yet further, microlenses 152 may be formed from binary optics. Such binary optical lenses may resemble a stepped arrangement. Further, the hemispherical microlens 252 may have a diameter that is larger than a size of the detector. For example, with a square detector having a 350 micron side length, the hemispherical microlens 252 could have a diameter of 440 microns. It will be understood that the dimensions and/or shape of the microlens 252 may be selected based on an incident optical beam (e.g., from a given field of view). For example, the microlens 252 may be adjusted based on a predetermined f-number of the optical system, photodetector element size, and/or other characteristics of the optical system.

The encapsulation 250 may protect the system 200 from scratches and other damage and, via microlens 252, may magnify the active area. For example, the encapsulation 250 may provide protection for wirebonds and may be substantially optically transparent within the wavelengths of interest.

In some embodiments, the microlens 252 is recessed with respect to a primary surface 251 of the encapsulation 250. In such a scenario, the microlens 252 may be better protected against physical damage.

In some embodiments, the plurality of detector elements 220 may be disposed along a first surface (e.g., the top) of the substrate 210 and a ball grid array 256 (BGA) may be disposed along a second, opposite surface of the substrate 210. Among other possibilities, the ball grid array 256 may provide one or more electrical interconnects to other electrical systems, devices, and/or elements. For example, various elements of substrate 210 may be electrically coupled to a power supply and/or other electronic components (e.g., a read-out integrated circuit (ROIC)) via BGA 256. In an example embodiment, the conductive plug 247 may be coupled to at least one signal ball 249 of the BGA 256.

While a ball grid array is described and illustrated with regard to system 200, other interconnect types are contemplated. For example, substrate 210 could alternatively or additionally include a pin grid array and/or be compatible with a land grid array.

Figure 2B:
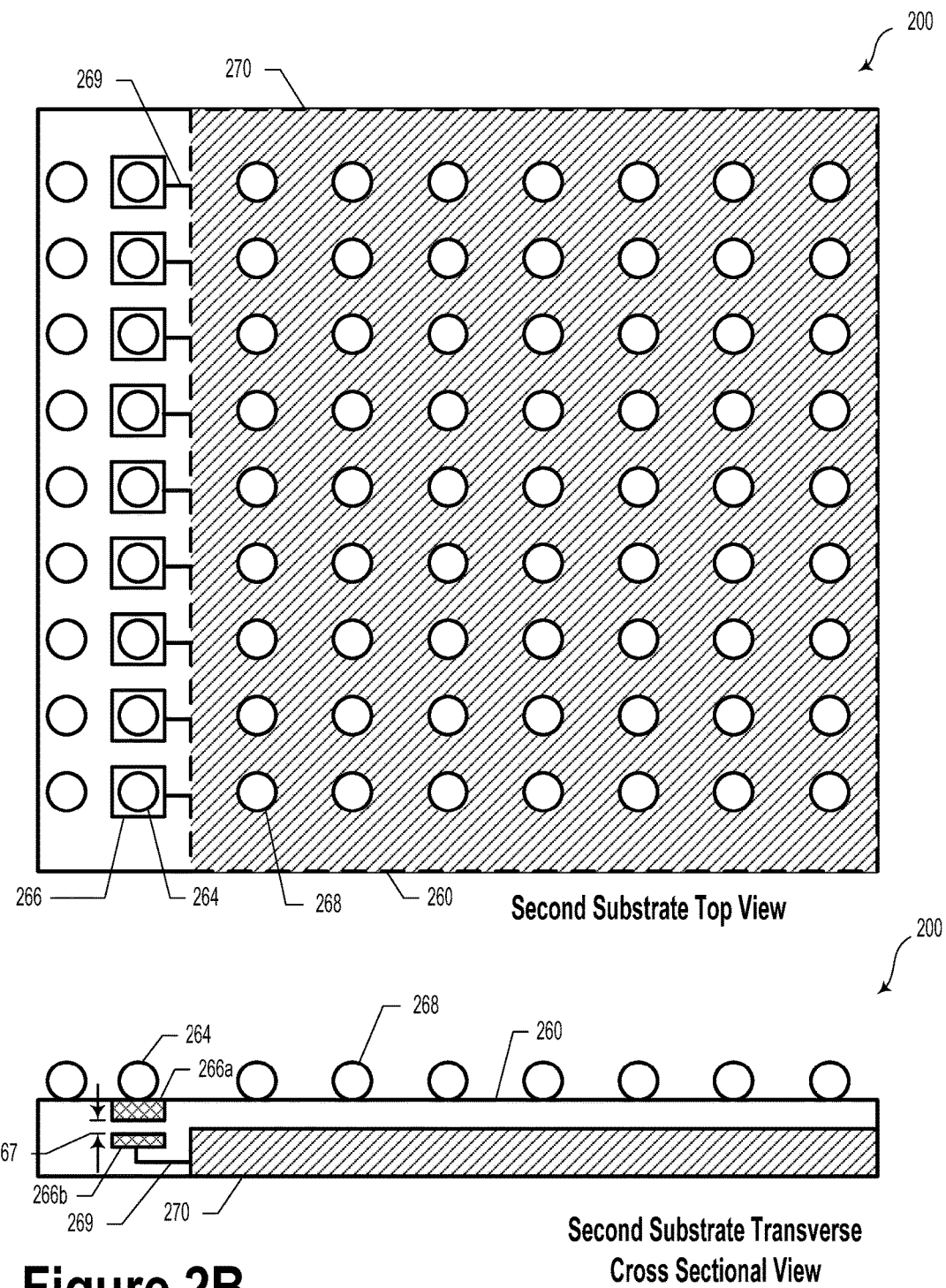
FIG. 2B illustrates a portion of a system, according to an example embodiment.

FIG. 2B illustrates a portion of system 200, according to an example embodiment. Namely, as illustrated in FIG. 2B, the portion of system 200 may include a second substrate 260. As described herein, the second substrate 260 may include a BGA 268 that may include an array of indium balls that correspond, at least in part, to the ball array of BGA 256. The second substrate 260 also includes a read-out circuit 270 having a plurality of channels (e.g., a plurality of discrete signal inputs). Each channel 269 of the plurality of channels is capacitively coupled to a respective photodetector (photodetector 220) via a respective capacitor 266.

The capacitor 266 may include two conductive plates 266a and 266b, which may be formed from a metal such as copper, aluminum, or another conductive material. The conductive plates 266a and 266b may be separated by a gap 267. The gap 267 may include a dielectric material, such as silicon dioxide or another electrically-insulating material. Additionally or alternatively, the gap 267 may include air or another gas. In an example embodiment, the capacitor 266 may provide a DC-blocking function with respect to the inputs of the read-out circuit 270.

The read-out circuit 270 may represent an amplifier or another type of read-out circuitry configured to receive respective photosignals from the plurality of detector elements 220. As an example, a detector element may provide a respective photosignal to the read-out circuit 270 via wire bond 248, signal pad 246, conductive plug 247, first signal ball 249, second signal ball 264, capacitor 266, and channel input 269. It will be understood that other signal routing arrangements are possible to provide a photosignal to the read-out circuit 270.

The read-out circuit 270 may receive and amplify the respective photosignals from the plurality of detector elements 220. The read-out circuit 270 may carry out a variety of other functions including, but not limited to, signal routing/selection (e.g., switch, multiplexer, or demultiplexer), and signal processing (e.g., denoising, decoding, or encoding). The read-out circuit 270 may additionally or alternatively be configured to provide various image processing tasks based on the received photosignals (e.g., time averaging).

In an example embodiment, the read-out circuit 270 could include a transimpedance amplifier (TIA), such as a Maxim MAX 3658 low noise TIA. In other embodiments, the TIA may be embedded in a custom ASIC or a dedicated read-out integrated circuit (ROIC).

Figure 2C:
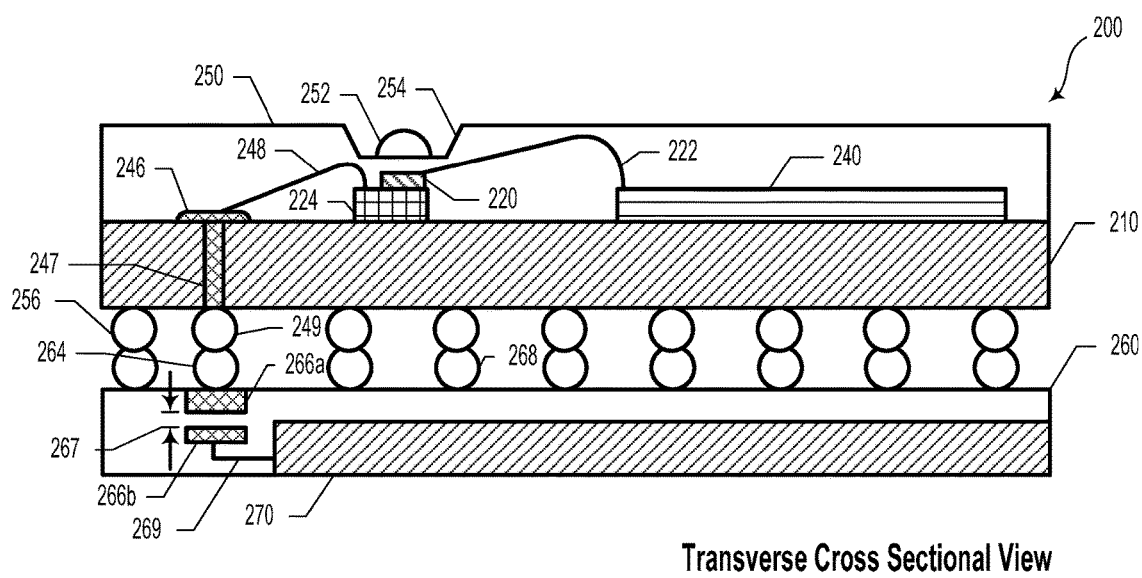
FIG. 2C illustrates a system, according to an example embodiment.

FIG. 2C illustrates system 200, according to an example embodiment. Namely, FIG. 2C illustrates the first substrate 210 and the second substrate 260 coupled together. In example embodiments, the first substrate 210 and the second substrate 260 may be coupled via an indium bump bonding process, fusion bonding, integrated circuit pin/socket, or another type of hybridization method. As illustrated in FIG. 2C, the first substrate 210 and the second substrate 260 may be coupled so as to align the corresponding BGAs 256 and 268. Furthermore, first signal ball 249 and second signal ball 264 may be electrically coupled so as to complete a conductive path that includes the photodetector 220, the capacitor 266, and the read-out circuit 270.

While FIGS. 2B and 2C illustrate that capacitor 266 as being a part of (e.g., embedded within) the second substrate 260, other arrangements and locations of capacitor 266 are possible, as described below.

Figure 2D:
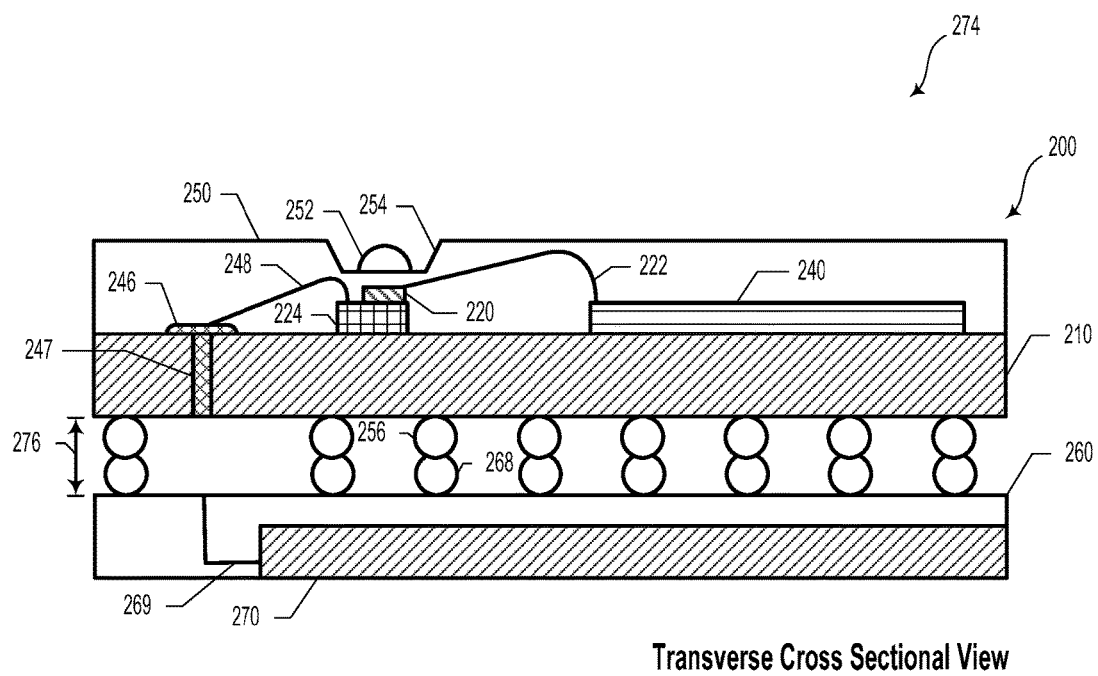
FIG. 2D illustrates a system, according to an example embodiment.

FIG. 2D illustrates a system 274, which may be another possible configuration of system 200. System 274 may include an air gap 276 between the first substrate 210 and the second substrate 260. In an example embodiment, a capacitance value based on the air gap 276 may develop between, for example, the conductive plug 247 and the input channel 269. In such a scenario, the air gap 276 may represent one or more of the plurality of capacitors 120 as illustrated and described in relation to FIG. 1. In other words, some embodiments of the present disclosure may include an air gap capacitor. For example, in reference to FIG. 2D, at least a portion of a bottom surface of the first substrate 210 and at least a portion of a top surface of the second substrate 260 may form the respective conductive plates of the plurality of capacitors 120. Furthermore, air or another gas in the air gap 276 may provide the dielectric material in the plurality of capacitors 120.

Figure 2E:
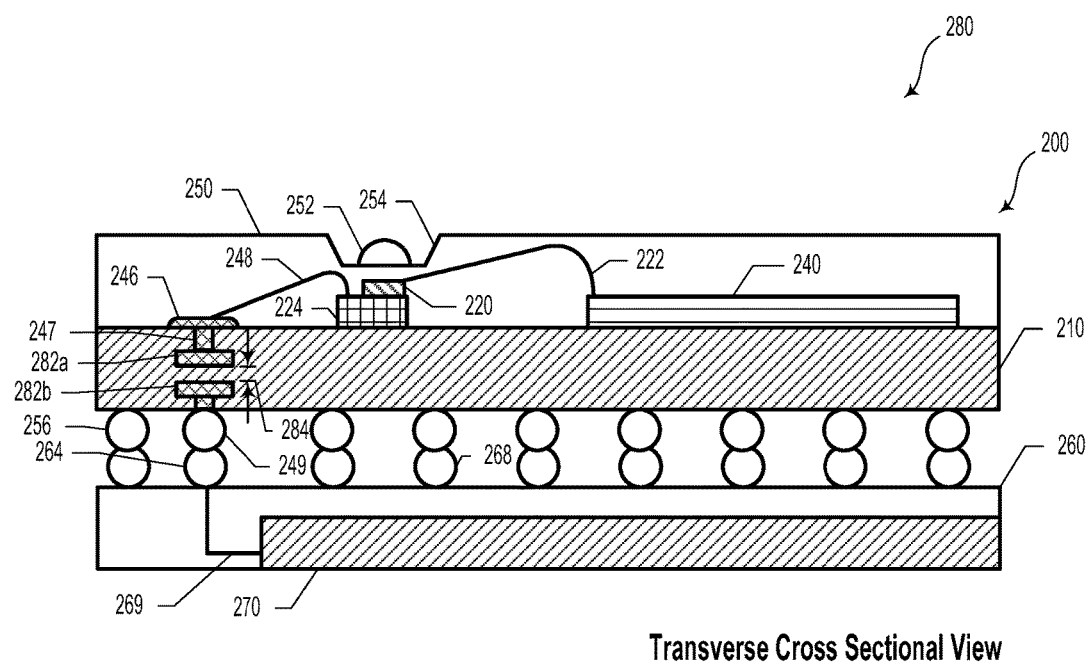
FIG. 2E illustrates a system, according to an example embodiment.

FIG. 2E illustrates a system 280, which may be a further possible configuration of system 200. Namely, system 280 may include a first substrate 210 with a capacitor that may be formed from two conductive plates 282a and 282b, which are separated by a gap 284. The gap 284 may include a dielectric material, such as silicon dioxide or another electrical insulator. In other words, the first substrate 210 may incorporate at least one capacitor of the plurality of capacitors 120 as illustrated and described in relation to FIG. 1. It is understood that other arrangements involving the plurality of capacitors 120 are possible and contemplated herein.

Figure 3:
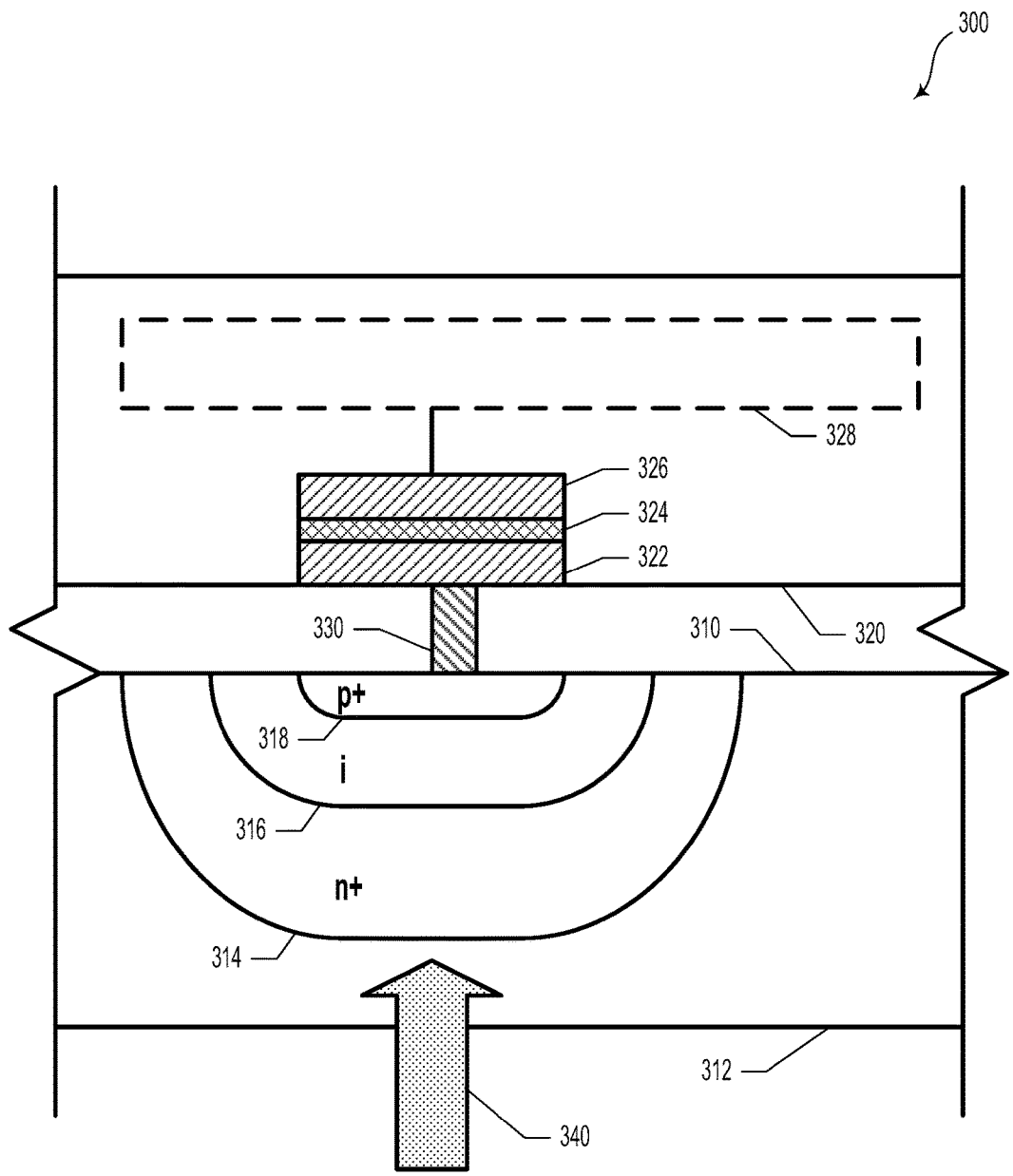
FIG. 3 illustrates a system, according to an example embodiment.

FIG. 3 illustrates a system 300, according to an example embodiment. At least some elements of system 300 may be similar or identical to corresponding elements illustrated and described with regards to FIGS. 1, 2A-2E. System 300 includes a first substrate 310 having a highly n-doped (n+) region 314, an intrinsic (i) region 316, and a highly p-doped (p+) region 318. The combination of the n-doped region 314, the intrinsic region 316, and the highly p-doped region 318 may form at least a portion of a photodetector 112 as illustrated and described with reference to FIG. 1. That is, the combination of the n-doped region 314, the intrinsic region 316, and the highly p-doped region 318 may form a p-n photodiode, an avalanche photodiode, and/or a single photon avalanche photodetector.

The photodetector may be illuminated with light 340, which may in turn be transmitted through a backside surface 312 of the first substrate 310. However, other illumination orientations (e.g., frontside illumination) are possible and contemplated. The system 300 includes a conductive element 330, which may include an indium bump bond, a wire bond, or another type of electrical connection. The conductive element 330 may connect a portion of the photodetector (e.g., the highly p-doped region 318) with a first conductive plate 322 of a second substrate 320. The first conductive plate 322 may be formed in a M1 layer of a semiconductor fabrication process. The second conductive plate 326 may be separated from the first conductive plate 322 by a gap 324, which may include a dielectric material. A combination of the first conductive plate 322, the gap 324, and the second conductive plate 326 may provide a capacitance value. In other words, the combination of the first conductive plate 322, the gap 324, and the second conductive plate 326 may provide at least one capacitor of the plurality of capacitors 120 as illustrated and described with regard to FIG. 1.

The system 300 also includes a read-out circuit 328. The read-out circuit 328 may include an amplifier and/or other circuitry as described elsewhere herein.

Figure 4A:
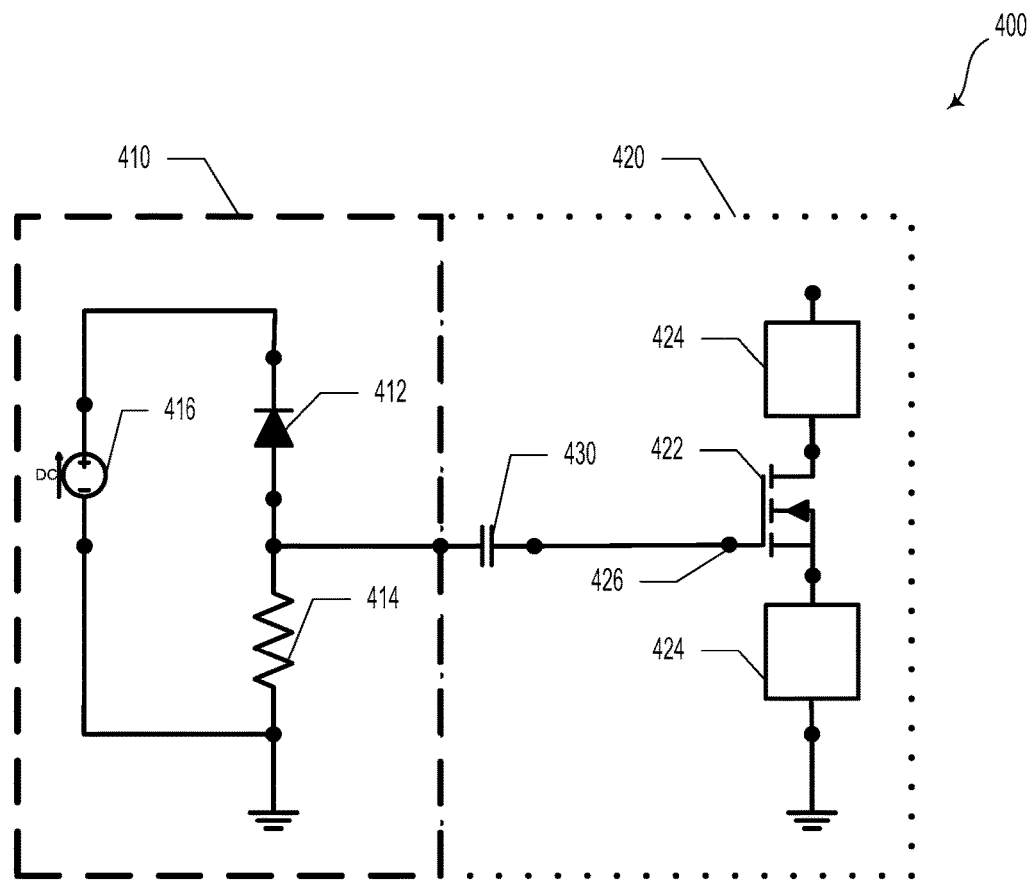
FIG. 4A illustrates a circuit, according to an example embodiment.
Figure 4B:
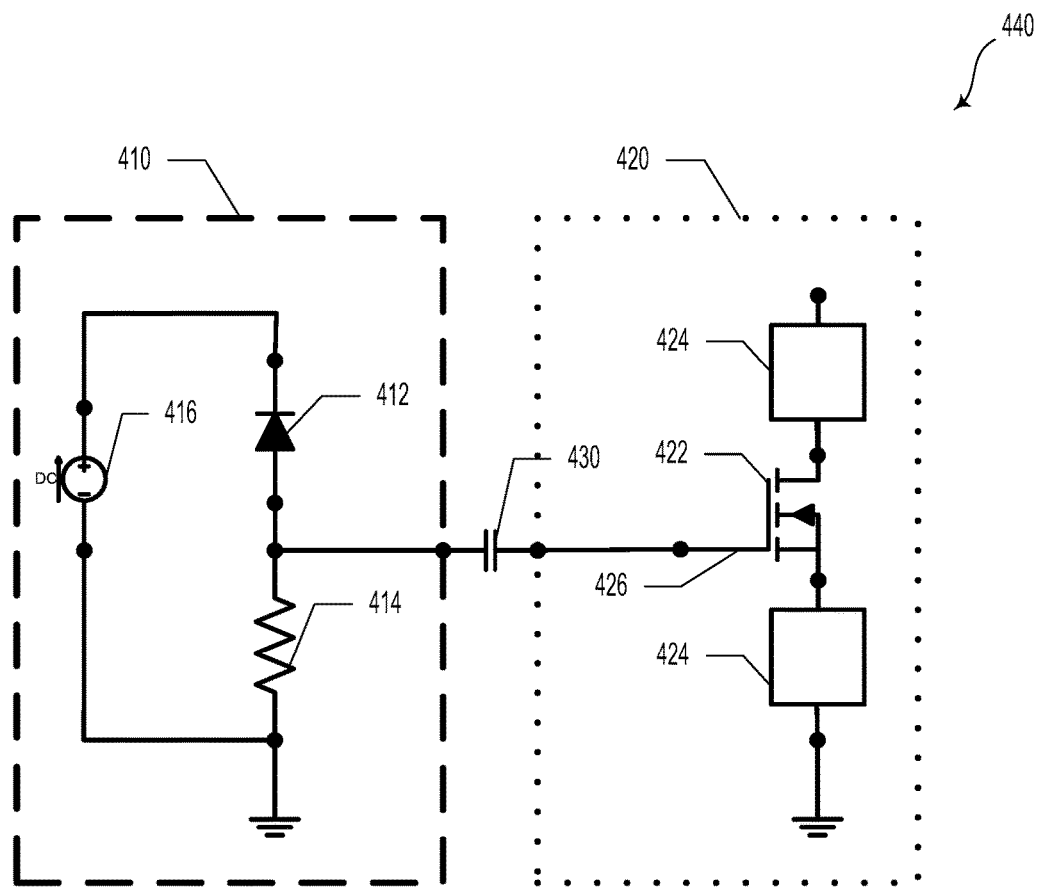
FIG. 4B illustrates a circuit, according to an example embodiment.
Figure 4C:
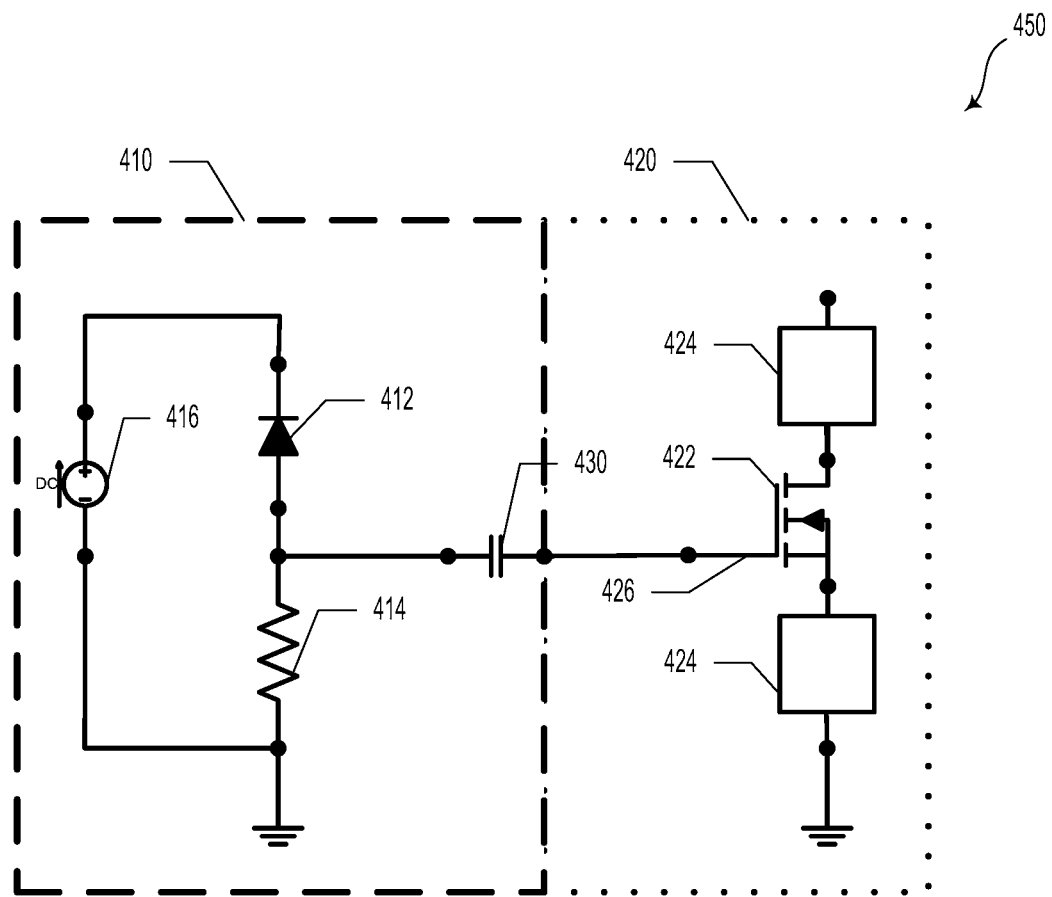
FIG. 4C illustrates a circuit, according to an example embodiment.

FIGS. 4A, 4B, and 4C illustrates circuits that represent different configurations of the system described herein.

FIG. 4A illustrates a circuit 400, according to an example embodiment. Circuit 400 includes a first substrate 410, which may include a power supply 416, a photodiode 412, and a resistor 414. In an example embodiment, the resistor 414 may represent at least a portion of a passive quenching circuit as described elsewhere herein. While a passive quenching circuit is illustrated in FIGS. 4A, 4B, and 4C, it will be understood that active quenching circuits may be incorporated into circuit 400 and are contemplated within the scope of the present disclosure.

Circuit 400 also includes a second substrate 420, which may include a capacitor 430, an input 426, a complementary metal oxide semiconductor (CMOS) transistor 422, and other ROIC elements 424. In an example embodiment, the second substrate 420 may include a silicon-on-insulator (SOI) material. In such a scenario, the capacitor 430 may be formed, at least in part, based on the arrangement of the SOI materials. For instance, the capacitor 430 may include two metal plates separated by the buried oxide layer, or a portion thereof.

FIG. 4B illustrates a circuit 440, according to an example embodiment. Circuit 440 may be schematically similar or identical to circuit 400. However, as illustrated in FIG. 4B, the capacitor 430 need not be incorporated into the first substrate 410 or the second substrate 420. For example, as described herein, the capacitor 430 may include an air gap between the respective substrates.

FIG. 4C illustrates a circuit 450, according to an example embodiment. Circuit 450 may be schematically similar or identical to circuits 400 and 440. However, as illustrated in FIG. 4C, the capacitor 430 may be incorporated into the first substrate 410. For example, as described herein, the capacitor 430 may be formed from two conductive plates, which may be arranged within or on the first substrate 410.

While FIGS. 4A, 4B, and 4C illustrate certain circuit configurations, it will be understood that other circuit configurations are possible. For example, a given circuit configuration may include more passive circuit elements (e.g., capacitors, inductors, resistors) than illustrated and described herein. Such passive circuit elements may be arranged on either the first substrate 410 or the second substrate 420. The passive circuit elements may provide, as an example, a pulse shaping function. Other functions of the passive circuit elements are possible and contemplated.

Figure 4D:
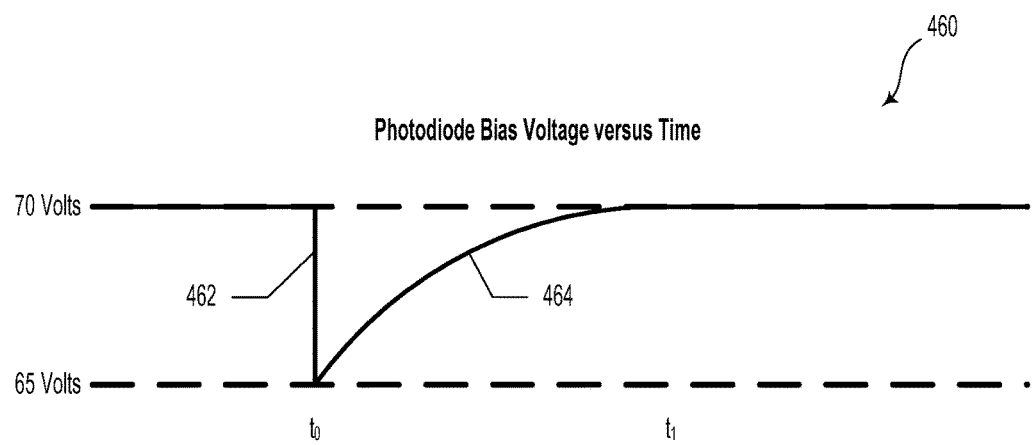
FIG. 4D illustrates a waveform, according to an example embodiment.

FIG. 4D illustrates a waveform 460, according to an example embodiment. Specifically, waveform 460 may represent a photodiode bias voltage versus time. Namely, under reverse-bias conditions, the avalanche photodiodes described herein may be biased at voltages of 70 volts or more. Upon an absorption event at to with a photon (e.g., having a wavelength of 800-905 nm or 1550 nm), an avalanche current process may begin. As impact ionization current flows within the photodiode, the device voltage 462 may drop within a sub-picosecond fall time. When the voltage drops below the reverse bias voltage level (e.g., 65 volts), the avalanche current process may be "quenched" and slow down and/or reverse. In such a scenario, the device voltage 464 may slowly recover to 70 volts by time $t_1$, effectively "resetting" the photodiode to enable subsequent photon detection events.

Figure 4E:
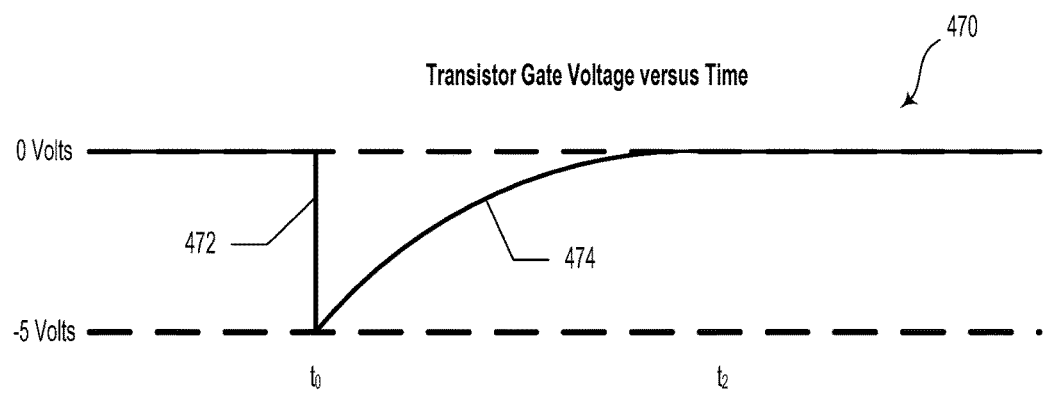
FIG. 4E illustrates a waveform, according to an example embodiment.

FIG. 4E illustrates a waveform 470, according to an example embodiment. In such an embodiment, waveform 470 may represent a transistor gate voltage versus time. That is, FIG. 4E and the waveform 470 may illustrate the voltage signal provided to an input (e.g., a gate connection) of a transistor (e.g., transistor 422) of a read-out circuit, such as read-out circuit 152. In example embodiments, the waveform 470 may illustrate the effect of capacitor 430 to reduce or eliminate the DC offset due to the reverse-bias of the photodiode. Namely, while the photodiode is under reverse-bias, waveform 470 may be at zero volts. Upon initiation of the avalanche current process at $t_0$, the gate voltage 472 may decrease to about −5 volts. The gate voltage 474 may then recover to zero volts by time $t_2$. In some embodiments, a gate voltage recovery time (e.g., $t_2$-$t_0$) may be greater than a quenching recovery time ($t_1$-$t_0$). In some embodiments, the gate voltage recovery time and the quenching recovery time may be in the range of picoseconds, nanoseconds, or microseconds.

It will be understood that other voltage values are possible for waveforms 460 and 470. For example, the transistor gate voltage may be more or less than 5 volts. Similarly, the reverse bias voltage across the photodiode may be more or less than 70 volts.

It will be understood that the embodiments described herein may provide an interface between the high voltage signals of avalanche photodiodes and digital circuits. For example, conventional CMOS devices may have a desired input voltage of 5.5 volts or less so as to prevent damage to CMOS circuits, which may be sensitive to even modest voltage levels (e.g., electrostatic discharge, etc.). In such scenarios, the present disclosure may provide a way to transduce high voltage signals (or at least signals with a DC offset of greater than 50 volts) so as to satisfy the desired input voltage, which may be at a lower voltage, with no DC offset. In doing so, the need for an intermediate step involving complicated analog read-out circuitry may be reduced or avoided completely.

Furthermore, as the described capacitor devices may be incorporated into the existing substrates (or may be formed by the air gap between the substrates themselves), the embodiments described herein may reduce fabrication/manufacturing cost and/or complexity.

III. Example Methods of Manufacture

Figure 5:
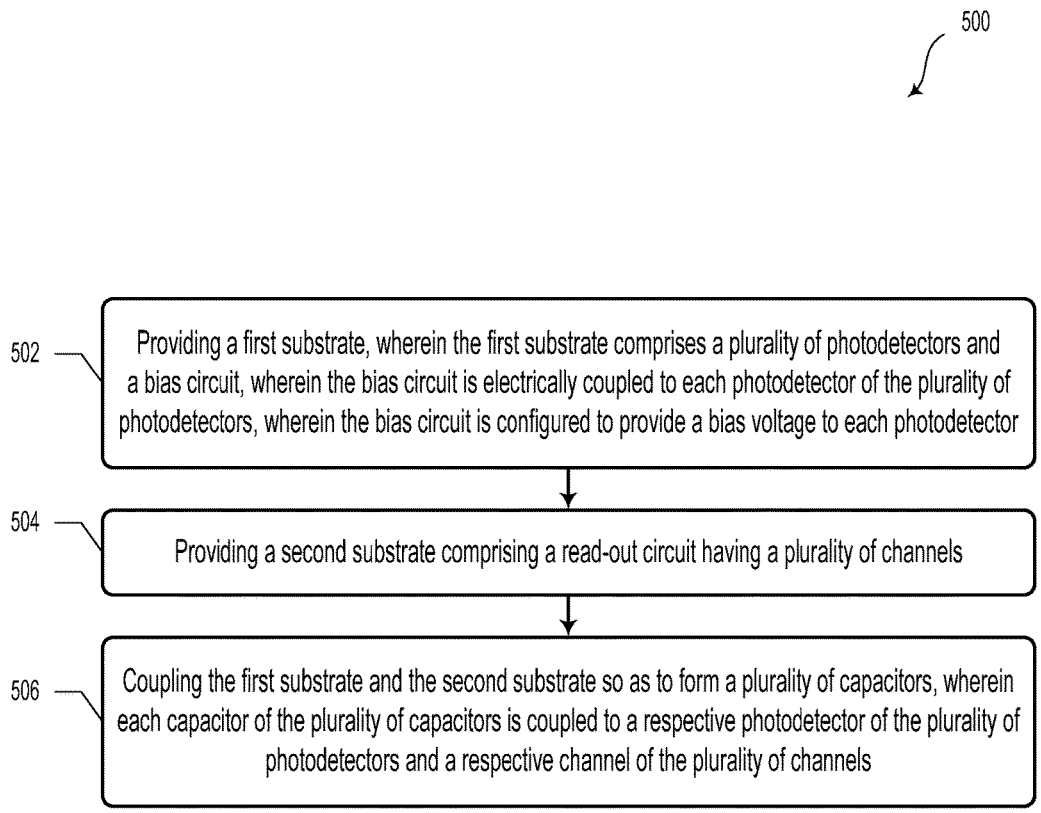
FIG. 5 illustrates a method, according to an example embodiment.

FIG. 5 illustrates a method 500, according to an embodiment. The method 500 may include various blocks or steps. The blocks or steps may be carried out individually or in combination. The blocks or steps may be carried out in any order and/or in series or in parallel. Further, blocks or steps may be omitted or added to method 500. The blocks of method 500 may be carried out to form or compose the systems 100, 200, 300, or circuits 400, 440, or 450 as illustrated and described with regard to FIGS. 1, 2A, 2B, 2C, 2D, 2E, 3, 4A, 4B, and 4C.

Block 502 includes providing a first substrate. The first substrate includes a plurality of photodetectors. The photodetectors may be single photon avalanche photodiodes (SPADs). Other types of photodetectors are contemplated. The first substrate also includes a bias circuit. The bias circuit is electrically coupled to each photodetector of the plurality of photodetectors. Furthermore, the bias circuit may be configured to provide a bias voltage to each photodetector. In some embodiments, the bias circuit includes a passive quenching circuit. Yet further, some embodiments include that the bias voltage is at least 70 volts.

Block 504 includes providing a second substrate. The second substrate includes a read-out circuit having a plurality of channels. In an example embodiment, the read-out circuit may be a digital read-out integrated circuit (ROIC). Furthermore, providing the second substrate may include fabricating the digital read-out integrated circuit (ROIC) according to a complementary metal-oxide-semiconductor (CMOS) process. As an example, the CMOS process may include design features (e.g., gate widths and/or channel lengths) less than 32 nanometers in size.

Block 506 includes coupling the first substrate and the second substrate so as to form a plurality of capacitors. Each capacitor of the plurality of capacitors is coupled to a respective photodetector of the plurality of photodetectors and a respective channel of the plurality of channels. In an example embodiment, the first substrate and the second substrate may be coupled via at least one of: a fusion bonding process, a die bonding process, a wafer bonding process, or a bump bonding process. Other manufacturing or fabrication techniques configured to fasten, abut, or adhere two substrates to one another are contemplated herein.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. A system comprising:
a first substrate comprising:
a plurality of photodetectors; and
a bias circuit, wherein the bias circuit is electrically coupled to each photodetector of the plurality of photodetectors, wherein the bias circuit is configured to provide a bias voltage to each photodetector; and
a second substrate comprising:
a silicon-on-insulator (SOI) material;
a plurality of capacitors, wherein:
each capacitor of the plurality of capacitors is electrically coupled to a respective photodetector of the plurality of photodetectors; and
each capacitor comprises two metal layers separated by a buried oxide layer of the SOI material; and
a read-out circuit having a plurality of channels, wherein each channel of the plurality of channels is capacitively coupled to a respective photodetector of the plurality of photodetectors via a respective capacitor of the plurality of capacitors.

2. The system of claim 1, wherein the read-out circuit comprises a complementary metal-oxide-semiconductor (CMOS) digital read-out integrated circuit (ROIC).

3. The system of claim 2, wherein the complementary metal-oxide-semiconductor (CMOS) digital read-out integrated circuit (ROIC) includes design features less than 32 nanometers in size.

4. The system of claim 1, wherein the plurality of photodetectors comprises a plurality of single photon avalanche photodetectors (SPADs).

5. The system of claim 1, wherein the bias circuit comprises a passive quenching circuit, wherein the bias voltage is at least 70 volts.

6. The system of claim 1, wherein each channel comprises a respective CMOS transistor, wherein each capacitor of the plurality of capacitors is electrically coupled to an input gate terminal of the respective CMOS transistor.

7. The system of claim 6, wherein a respective capacitance value of each capacitor of the plurality of capacitors is selected based on at least the bias voltage and a desired input voltage at the respective input gate terminal.

8. The system of claim 7, wherein the desired input voltage is less than 5.5 volts.

9. The system of claim 1, wherein the plurality of capacitors is disposed on the first substrate.

10. The system of claim 1, wherein the system is at least a portion of an optical receiver of a Light Detection and Ranging (LIDAR) system.

11. A method of manufacture comprising:
providing a first substrate, wherein the first substrate comprises:
a plurality of photodetectors; and
a bias circuit, wherein the bias circuit is electrically coupled to each photodetector of the plurality of photodetectors, wherein the bias circuit is configured to provide a bias voltage to each photodetector;
providing a second substrate comprising a read-out circuit having a plurality of channels wherein the second substrate comprises a silicon-on-insulator (SOI) material;
forming a plurality of capacitors on the second substrate, wherein:
each capacitor of the plurality of capacitors is electrically coupled to a respective photodetector of the plurality of photodetectors; and
each capacitor comprises two metal layers separated by a buried oxide layer of the SOI material; and
each channel of the plurality of channels is capacitively coupled to a respective photodetector of the plurality of photodetectors via the respective capacitor of the plurality of capacitors; and
coupling the first substrate and the second substrate.

12. The method of claim 11, wherein coupling the first substrate and the second substrate comprises at least one of a fusion bonding process, a wafer bonding process, or a bump bonding process.

13. The method of claim 11, wherein the plurality of photodetectors comprises a plurality of single photon avalanche photodetectors (SPADs).

14. The method of claim 11, wherein the bias circuit comprises a passive quenching circuit, wherein the bias voltage is at least 70 volts.

15. The method of claim 11, wherein the read-out circuit comprises a complementary metal-oxide-semiconductor (CMOS) digital read-out integrated circuit (ROIC) that includes design features less than 32 nanometers in size.

* * * * *